United States Patent [19]

Barnett

[11] Patent Number: 4,778,478
[45] Date of Patent: Oct. 18, 1988

[54] METHOD OF MAKING THIN FILM PHOTOVOLTAIC SOLAR CELL

[75] Inventor: Allen M. Barnett, Newark, Del.

[73] Assignee: University of Delaware, Newark, Del.

[21] Appl. No.: 811,502

[22] Filed: Dec. 20, 1985

Related U.S. Application Data

[62] Division of Ser. No. 321,381, Nov. 16, 1981, Pat. No. 4,571,448.

[51] Int. Cl.$^4$ .................................... H01L 31/18
[52] U.S. Cl. ......................... 437/5; 156/622; 427/74
[58] Field of Search .................. 29/572, 584, 585; 148/171, 172, 183, DIG. 54, DIG. 122, DIG. 153; 156/608, 616 R, 622, DIG. 88; 136/258 PC, 261; 427/74, 76, 86, 87

[56] References Cited

U.S. PATENT DOCUMENTS

| | | | |
|---|---|---|---|
| 3,565,702 | 2/1971 | Nelson | 148/172 |
| 3,914,856 | 10/1975 | Fang | 29/572 |
| 3,961,997 | 6/1976 | Chu | 148/174 |
| 4,152,535 | 5/1979 | Deminet et al. | 136/258 PC |
| 4,305,776 | 12/1981 | Grabmaier | 156/605 |
| 4,328,390 | 5/1982 | Meakin et al. | 136/259 |

FOREIGN PATENT DOCUMENTS 55-108780  8/1980  Japan .................................... 136/259

OTHER PUBLICATIONS

H. J. Hovel et al., *IBM Tech. Disc. Bull.,* vol. 18, pp. 544–545 (1975).
W. Scott et al., *J. Electronic Mat'ls,* vol. 8, pp. 581–601 (1979).
S. I. Long et al., *J. Crystal Growth,* vol. 26, pp. 13–20 (1974).
K. Ito et al., *Jap J. Appl. Phys.* vol. 19 (1980), Suppl. 19-2, pp. 37–41.

*Primary Examiner*—Aaron Weisstuch
*Attorney, Agent, or Firm*—Ratner & Prestia

[57] ABSTRACT

Solar cell quality semiconductors are grown using a constant temperature sliding boat liquid phase process in a continuous or semi-continuous mode. The growth is driven by applying a temperature gradient or other gradient across the melt, with the substrate at a cooler temperature, after thermal equilibrium is obtained between the solution and the substrate. Growth occurs from the bottom of the solution to prevent contamination of the growth layers by extraneous particles in the solution.

37 Claims, 3 Drawing Sheets

METHOD OF MAKING THIN FILM PHOTOVOLTAIC SOLAR CELL

This application is a division of application Ser. No. 06/321,381, filed Nov. 16, 1981, now U.S. Pat. No. 4,571,448.

BACKGROUND OF THE INVENTION

A. Field of the Invention

This invention relates to the field of art of thin film photovoltaic solar cells.

B. Background Art

A photovoltaic solar cell, often referred to as a solar cell, is a semiconductor junction device which converts light energy into electrical energy. A typical photovoltaic solar cell is a layered structure comprising four principal layers: (1) an absorber-generator, (2) a collector-converter, (3) a transparent electrical contact, and (4) an opaque electrical contact. When light is incident upon the absorber-generator, the device generates a voltage differential between the two contacts and an electrical current which increases as the intensity of the light increases.

The absorber-generator (referred to as the "absorber") is a layer of semiconductor material which absorbs light photons and, as a consequence, generates minority carriers. Typically, the absorber captures photons and ejects electrons thus creating pairs of negatively charged carriers (electrons) and positively charged carriers ("holes"). If the absorber is a p-type semiconductor, the electrons are minority carriers; if it is n-type, the holes are minority carriers. As minority carriers are readily annihilated in the absorber by recombination with the plentiful majority carriers, they must be transported to a region where there are majority carriers before they can be utilized by an electrical circuit.

The collector-converter (the "collector") is a layer of material in electrical contact with the absorber wherein the majority carriers are of the same conductivity type as the minority carriers generated in the absorber. This layer "collects" minority carriers from the absorber and "converts" them into majority carriers. If the collector is an oppositely doped region of the same semiconductor as the absorber, the photovoltaic device is a p-n junction or homojunction device. If the collector is comprised of a different semiconductor, the device is a heterojunction; if the collector is an insulator and a metal, the device is a metal-insulator-semiconductor device; and, if the collector is metal, the device is a Schottky barrier device.

To utilize the photovoltaic properties described above, one needs to add electrical contacts. In general, one of the electrical contacts is transparent while the other is opaque. Either the opaque or transparent contact may also serve as a substrate.

Two other functions are usually added to solar cells: encapsulation to improve the durability and anti-reflection to increase the number of photons which penetrate into the device (rather than be reflected).

The central characteristic of the encapsulant is that it protects the solar cell from the environment. One side of the solar cell must have an optically transparent encapsulant.

In the case where the encapsulant is applied over the transparent contact, glasses have proven to be most successful. These glasses can be formed from a broad range of compounds based on silicon, oxygen, and other elements. In systems commonly used today, these glasses are bonded to a solar cell or module after fabrication, but development of integral encapsulants in the range of 5 microns thick directly applied to the solar cell is becoming a practice.

The opaque contact usually serves as the encapsulant for the surface that is not facing the source of light.

All of the semiconductor material systems under study for solar cells have high indices of refraction resulting in reflection from a planar surface in the range of 25 to 40 percent. In order to prevent these high reflection losses, anti-reflection layers are necessary.

There are two primary approaches to the reduction of reflection losses. Texturing of the surface of the semiconductor causes multiple reflections for incoming photons, reducing the net photon loss. Single or multi-layer anti-reflection coatings reduce reflection by both index matching and interference effects. A variation of the first approach is to build a textured layer into the encapsulant. Various combinations have been successfully utilized including texturing the semiconductor and providing an anti-reflection layer on top of this material.

Some of the design requirements for the type of cell described above are provided by Barnett and Rothwarf, "Thin-Film Solar Cells: A Unified Analysis of Their Potential" in *IEEE Transactions on Electron Devices*, Vol. 27, No. 4, April 1980.

Most of the solar cells being manufactured today evolved from the silicon semiconductor industry. These solar cells are made from wafers sliced from ingots. Improvements in ingot information, productivity, and improved wafer sawing techniques are being developed.

The lowest cost solar cells are made by depositing thin films of semiconductors on low cost substrates. These thin layers are designed to reduce the consumption of semiconductor material by 80% to 95% or more.

In particular, as described in the Nelson U.S. Pat. No. 3,565,702, issued Feb. 23, 1971, which disclosure is incorporated herein by reference, thin films can be deposited using a sliding boat, liquid phase process which deposits successive epitaxial semiconductive layers on a substrate from the liquid phase. This is performed, for example, by bringing one surface of the substrate in contact with a first solution consisting of a first molten metallic solvent in which a first semiconductive material is dissolved and then cooling the first solution in order to deposit a first epitaxial layer on the substrate. After the first layer is grown, the steps are performed again to deposit a second epitaxial layer. Alternately, it is well known in the art that the second layer may be formed by passing the substrate with some of the liquid film covering it through a dopant gas which will dope the second layer. It is known that the second layer can also be formed by diffusion or ion implantation.

Thin film silicon solar cells have been obtained by using other deposition techniques, such as vapor (CVD, vacuum, or sputtering), and molten liquid. With the exception of CVD on single crystal metallurgical grade silicon, these techniques have not produced high performance solar cells with low silicon utilization. One of the greatest drawbacks has been the high material costs encountered in the preparation of single crystal silicon solar cells. Preparation of thin films by way of vapor deposition on non-silicon substrates also tended to produce small grains which led to minority carrier recombination at the grain boundaries or other effects which limited the diffusion length and hence, reduced the collection of minority carriers and their conversion into majority carriers, thereby reducing the current. This has led to the use of molten liquid growth on foreign substrates which has demonstrated large grains but considerable surface and bulk contamination. Also thicknesses of 100 microns or more seem required. Grain boundary recombination has also led to reduced currents.

Accordingly, polycrystalline silicon has not been demonstrated with high efficiency in a low-cost thin film configuration on non-silicon substrates. The limited efforts which used a low-cost configuration have reported efficiencies under five percent. The higher efficiencies for polycrystalline silicon are based on devices made on higher cost substrates and with much thicker films.

An object of this, invention to drive the growth of the semiconductor on a metallurgical barrier layer the application of a gradient (either temperature or electric field) across the melt with the substrate being cooler such that the whole apparatus including the melt is not cooled during the growth phase of the liquid phase epitaxial process.

It is an object of this invention to provide an optically reflective barrier layer between the substrate and the first semiconductor layer in order to increase the performance of the cell.

It is also an object of this invention to provide a method of making thin film photovoltaic solar cells which is of extremely low-cost and yet produces high light-to-electrical energy conversion efficiency.

Another object of this invention is to provide a method of continuous or semi-continuous semiconductor deposition which permits the growth of extremely large grains.

Yet another object of this invention is to provide a method of depositing extremely thin, large grain semiconductors on a low-cost substrate.

Yet another object of this invention is to provide a method of depositing large grain semiconductors which do not have contamination at the grain boundaries.

SUMMARY OF THE INVENTION

A thin film photovoltaic device and method in which the device is formed on a substrate selected from a group consisting of metals, metal alloys, and metallurgical grade silicon having semiconductor layers functioning as a collector, an absorber, and a metallurgical barrier layer. In one embodiment the surface of the substrate may be textured and either a ¼ wavelength optical reflection metallurgical barrier layer or a transparent metallurgical barrier layer may be applied over the substrate. First and second semiconductor layers are then deposited from a liquid saturated solution comprising semiconductor material dissolved in a molten metallic or compound solvent. A second semiconductor layer may be provided by doping a layer of liquid saturated solution that remains on the deposited first layer and then growing the doped layer to form a photovoltaic junction. A temperature or electric field gradient may be applied across the saturated solution to drive the growth of the semiconductor layer. The texturing provides for back surface reflection of light so as to increase the photon absorption within the semiconductor layer.

DETAILED DESCRIPTION OF THE PREFERRED EMBODIMENT

Figure 1:
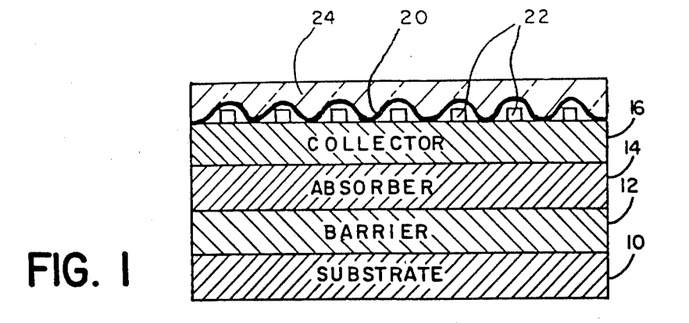
FIG. 1 is a schematic cross section, with portions enlarged, of a thin film photovoltaic cell in accordance with the invention.

Shown in FIG. 1 is a schematic cross-section of a thin film photovoltaic cell fabricated in accordance with the invention. The cell has metallic substrate 10, made of a metal alloy such as iron/nickel (25 microns thick), a metallurgical grade silicon, or other low-cost material. The thermal expansion coefficient of the substrate is matched to the semiconductor. The substrate has been textured to trap reflected photons in the semiconductor layer. Above substrate 10 is metallurgical barrier layer 12 which can be any material such as silicon carbide or tin oxide (in the range of 0.1 microns thick) or both which prevents contamination of the semiconductor layers 14 and 16 by the substrate. Although an optical reflection metallurgical barrier, having a thickness or depth that is substantially one-quarter of the wavelength of the light to be reflected plus an integral number of wavelengths is preferred, an optically transparent conducting metallurgical barrier may also be used. A first layer of solution-grown semiconductor material such as silicon (approximately 5–30 microns thick) forms thin-film absorber-generator 14. A second thin layer of solution grown silicon (about 0.1 to 2 microns thick) forming collector-converter 16 is disposed on absorber 14, thus defining a lattice-matching photovoltaic junction there-between. It will be understood that by providing the proper dopants in the solution, absorber 14 may be made of opposite conductivity type such as n-type, even though both the absorber 14 and collector 16 are made of the same semiconductor material. The material for the absorber and collector may be chosen from the group consisting of silicon, gallium arsenide, indium phosphide, zinc phosphide, cadmium sulfide, zinc-cadmium sulfide and cadmium telluride. Transparent contact 22, such as a silver or nickel grid, forms a metal electrical contact on collector 16. Anti-reflection coating 20 which traps photons is formed over the transparent electrical contact 22. Glass encapsulant 24 is formed over the anti-reflection coating.

Figure 2:
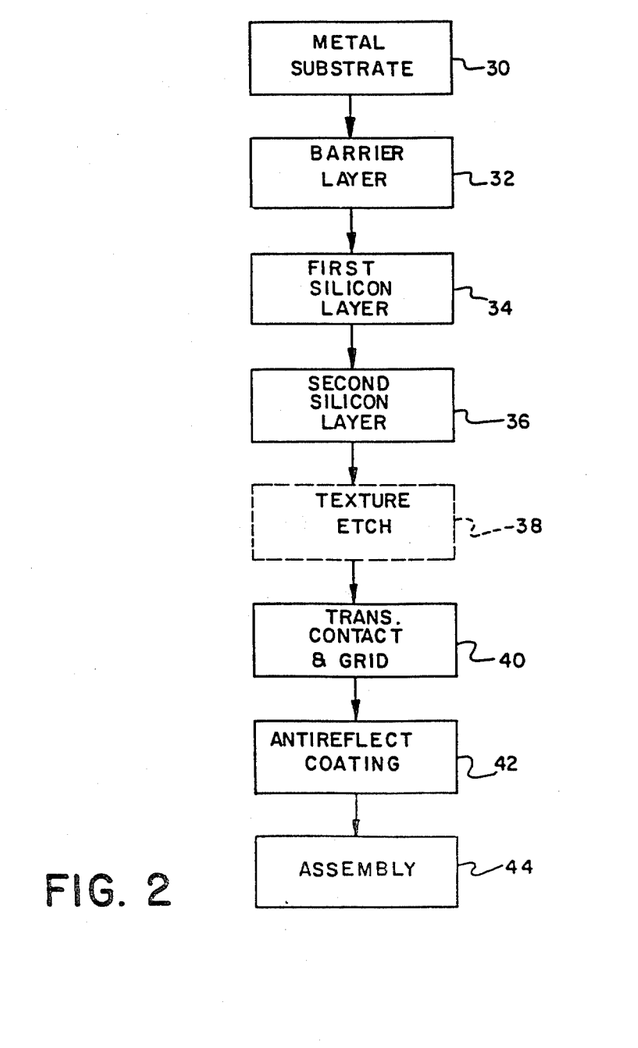
FIG. 2 is a flow diagram of the steps of the method of fabricating a thin film photovoltaic cell in accordance with the invention.

FIG. 2 is a flow diagram illustrating the preferred method of depositing successive layers of crystalline semiconductor material on a metallic substrate from the liquid phase using a form of the sliding boat process.

The first step 30 involves providing a metal, metal alloy, metal-coated film, or metallurgical grade semiconductor material such as silicon or other low-cost substrate which also acts as the opaque electrical contact. The preferred substrates are an iron-nickel alloy or a single crystal or large grain polycrystalline metallurgical grade silicon. The thickness of this substrate is approximately 25 microns, except for metallurgical grade silicon which is thicker to provide mechanical stability. A metallic substrate, such as of metal alloys consisting of between 38 and 42% nickel and between 62 and 58% iron, is preferred so as to approximately match the temperature coefficient of expansion of silicon. These materials are commercially available. Specifically, to provide optical confinement, the substrate surface should have a predetermined geometrical shape designed to direct most of the incident radiation into a direction so that internal reflection takes place within the semiconductor layer that overlays the substrate. The geometrical shape provides a back surface reflection and can be designed for any material in which photon absorption can be improved, such as amorphous silicon. It is preferred to texture the metal substrate with the use of a roller having a surface which impresses a specially designed reflector geometry onto the substrate. The geometry is designed to cause total internal reflection of the incident light as it is reflected back through the cell. The substrate can also be textured chemically through the use of an anisotropic etch.

The substrate may also be textured to provide optical confinement. The effects of optical confinement due to texturing has been described by Goetzberger, Conference Record, *Fifteenth Photovoltaic Specialists Conference*, Orlando, Fla. May 1981, pp. 867–870, which is incorporated herein by reference.

Preliminarily, to the second step, metal substrate 10 is thoroughly cleaned in a manner well-known in the art. The second step 32 involves depositing on substrate 10 barrier layer 12. The barrier layer 12 provides two important functions. First, it prevents contamination of the melt and the silicon growth by the substrate 10 by forming a metallurgical barrier. Second, barrier 12 may be optically reflective to increase the performance of the cell. Any conducting or semiconducting barrier material with an energy gap greater than silicon and which makes an ohmic contact with both the grown silicon and the substrate will be satisfactory. Silicon carbide and tin oxide can perform the required transparent conducting metallurgical barrier function in addition to forming an optical reflection layer.

The optical reflection layer thickness is preferably one-quarter of the wavelength of light to be reflected. When the index of refraction of the optically transparent layer is less than the index of refraction of the first grown semiconductor layer but less than the index of refraction of the substrate, it is preferred that the barrier be substantially a $\frac{1}{4}$ wavelength reflector. The thickness of the barrier layer may be increased by any integral number of wavelengths (including zero) and still maintain the quarter-wave reflector properties. These wavelengths are related to photon energies slightly above the energy gap of absorber layer 14. The wavelengths of photons having energies slightly above the energy gap are approximately 1 micron. α-Silicon Carbide has a refractive index of approximately 2.69, requiring a barrier layer thickness of approximately 0.093 microns. Minor variations of this thickness (+10%) affect short circuit current only slightly and are therefore acceptable. The barrier layer thickness is usually approximately 0.09 microns.

The resistivity of the barrier layer is chosen to give a voltage drop of about 0.005 volts, or less than one percent of the total voltage at 35 milliamps per square centimeter. Resistivities less than 1000 ohm-centimeters are recommended for minimum losses.

For ohmic contacts, the barrier layer should have the same conductivity type as the first grown semiconductor layer but the barrier may simply be either an optically transparent layer or a quarter-wave reflector. The barrier layer can be formed by any well-known thin film techniques such as D.C. or R.F. sputtering, evaporation, or spraying. Carbon has been used as the barrier layer in the prior art, but it acts as a photon absorber.

In combining the first and second steps, therefore, it is possible to have at least four possible combinations of substrate and barrier layer. One combination is a transparent barrier layer consisting of either a conductor or semiconductor material on top of a nontextured substrate. A second combination is a transparent barrier layer on top of a textured substrate. A third combination is an optical reflection, one-quarter wavelength reflector barrier layer on top of a textured substrate. A fourth combination is an optical reflection, one-quarter wavelength reflector barrier layer on top of a nontextured substrate. In all cases, however, at least a transparent barrier layer is provided above a substrate. The transparent barrier may not have the one-quarter wavelength reflector properties and the substrate may not be textured, but the barrier is still transparent to light.

The third step 34 in the process is the depositing of the first semiconductor layer, preferably silicon, to form absorber 14 from a metallic solution saturated with the semiconductor material. Tin is preferred as the solvent because it does not affect the silicon conductivity type and because silicon growths from tin melts have demonstrated the required minority carrier diffusion length which is twice the absorber film thickness.

Using tin, the temperature above the tin melting point of 232 degrees centigrade but below the steel melting point of 1425 degrees centigrade may be used for the furnace boat. A melt at 950° centigrade, for example, would have a constituency of approximately 6 atomic percent silicon and 94 atomic percent tin. To maximize voltage while maintaining diffusion lengths greater than 10 microns, dopant concentrations in the range of $5 \times 10^{17}$ atoms per cubic centimeter should be used. P-type dopants such as boron, aluminum, or gallium are acceptable.

The silicon precipitate from the first tin melt is deposited on barrier 12 using the sliding boat technique. This step is begun when the melt and the substrate are at thermal equilibrium in order to prevent the silicon from forming at the bottom of the melt before the deposition process is initiated. The silicon is precipitated out of the solution and grown on top of the barrier layer 12.

In order to promote growth at a constant furnace temperature, a temperature gradient, or other gradient, is applied across the melt after the first growth has been initiated. This gradient can be in the range of 1° centigrade to 20° centigrade per centimeter although wider ranges are acceptable.

The growth of silicon on the barrier is driven by the temperature gradient. Also, the gradient provides for a sufficient amount of silicon to get into tin melts. It has been known to promote growth by cooling the melt while depositing an epitaxial layer on the substrate and while the surface of the substrate was still covered by liquid film of the first melt. In accordance with the invention, a temperature gradient is applied to the melt with the substrate being at the cooler temperature. The melt is not generally cooled during the growth phase of the saturated solution growth process of this invention. The temperature gradient may be caused by the addition of a heat sink below the substrate, providing a heat loss path below the substrate or by the placing of a tube underneath the surface and allowing a cooler gas to flow below the substrate. The gradient can be controlled by the gas flow rate through the tube. A gradient is used to drive the growth of each epitaxial layer even if no optical reflection barrier layer or textured substrate is used prior to the deposition of the first grown semiconductor material. Specifically, a gradient may be applied directly to the first grown semiconductor material over a nontextured substrate.

Alternately, the temperature gradient can be controlled using extra heating elements, one above the melt (distal to the substrate) and the other below the substrate. These elements can be external to the whole growth assembly.

An alternate gradient to promote growth can be provided by creating an electric field across the melt.

For continuous growth, excess silicon is floated on top of the melt. The total melt can be periodically (or continuously) replenished by adding mixtures of tin, silicon, and dopant at the proper concentrations, since growth equilibrium is achieved. Growth from the bottom will keep particles and other contaminants from the solar cell layers.

For growth on a non-crystalline substrate, pulling the substrate through the solution should lead to the seeding of very large crystallites by the initial crystals that are grown. Alternately a single crystal seed can be attached to the substrate before growth is initiated. This seeded growth will also lead to large crystallites.

Another alternative growth technique requires cooling the first and second saturated solutions continuously for approximately one hour while pulling the substrate(s) through the solutions, then removing the substrate(s) from the growth solutions, reheating both saturated solutions for 5 to 15 minutes, replenishing the solutions, reestablishing equilibrium, then starting the growth sequence again.

For a semiconductor deposition rate of 1 micron per minute the substrate will be in the solution for 10 minutes to grow a 10 micron thick layer. Considering a solution that is 10 centimeters wide and 25 centimeters long, the substrate will be pulled through using the sliding boat technique, at the rate of 2.5 centimeters per minute. However, the thinner n-type region would require a shorter solution.

The fourth step 36 in the process is depositing the semiconductor layer 16 on top of the first semiconductor layer to form collector 16 from a tin and silicon melt that was saturated at a slightly lower temperature than for the first melt. N-type dopants such as phosphorous, arsenic, or antimony are acceptable having concentrations in the range of from $5 \times 10^{17}$ to $5 \times 10^{19}$ atoms per cubic centimeter. This second layer can also be etched to form an additional antireflection surface. These first semiconductor layers can be grown to a total thickness of approximately 5 to 50 microns.

The fifth step 38 in the process is the texture etching of the collector layer 16 by forming cones in the silicon material which will trap the photons causing multiple reflections until the photons enter the silicon. The cones are located on the top silicon surface. The recommended method of forming the cones is by anisotropic etching of the last silicon layer that is grown. If the junction is formed by growth from a saturated solution, the cones can be formed after the second (junction forming) silicon layer is grown. If the junction is formed by diffusion or ion implantation, the cones can be formed after the deposition of the first (and only) silicon layer. For silicon grown in a <100> direction, the following etch has been found to be satisfactory for cone forming: 55 seconds in 2% NaOH (aqueous) with 20% by volume isopropyl alcohol at 80° centigrade. For the more random orientations, expected in polycrystalline growth, variations in precleaning, time, temperature, and sodium hydroxide concentrations have been successfully utilized. In any case, this cone-forming step is optional and will be left out if the last grown semiconductor layer is too thin to tolerate the etching.

The sixth step 40 in the process is the depositing of a transparent electrical contact grid 22. The grid contacts can be applied by any of the standard solar cell techniques including evaporation, sputtering, screen printing, and contact printing. For increased grid conductivity, if required, plating (electro- or electroless) or solder-dipping can be used.

Preferably a silver or nickel grid is applied by passing the processed substrate through a printing apparatus where it is applied by screen printing through a mask, by contact printing or by photoresist masking and printing or plating processes.

A silver contact paste can be screen printed using standard techniques. After printing, the paste is fired at approximately 700° C. in air for about 30 seconds. Variations in this process can be used depending upon the specific paste chosen. Air firable nickel pastes (with approximately 20% glass frit) are also being developed for this application.

The seventh step 42 in the process is the depositing of an anti-reflection coating 20. A solution of titanium isopropoxide can be spray-coated on the top silicon surface to form the anti-reflection coating. This coating should then be baked out between 200° C. and 250° C. for 60 to 90 seconds followed by 10 seconds at 70° C. and 30 minutes at 200° C. Many other processes for forming the anti-reflection layer are satisfactory including evaporating layers of silicon oxide. A glass encapsulant 24 may be formed above the anti-reflection coating by flame spraying, arc spraying, evaporation, or electro-static bonding.

The eighth step 44 in the process is the assembling of solar cells into photovoltaic modules. Individual solar cells are cut from the strip. During this process, undesirable edge effects, such as junction shorting or electrical contact shorting, are also removed.

In this step, individual solar cells are wired together to form arrays. These arrays are then packaged into modules that provide environmental protection for the cell and include electrical output connectors. Assembly of the solar cells into modules can be done by a number of satisfactory conventional techniques.

Figure 3:
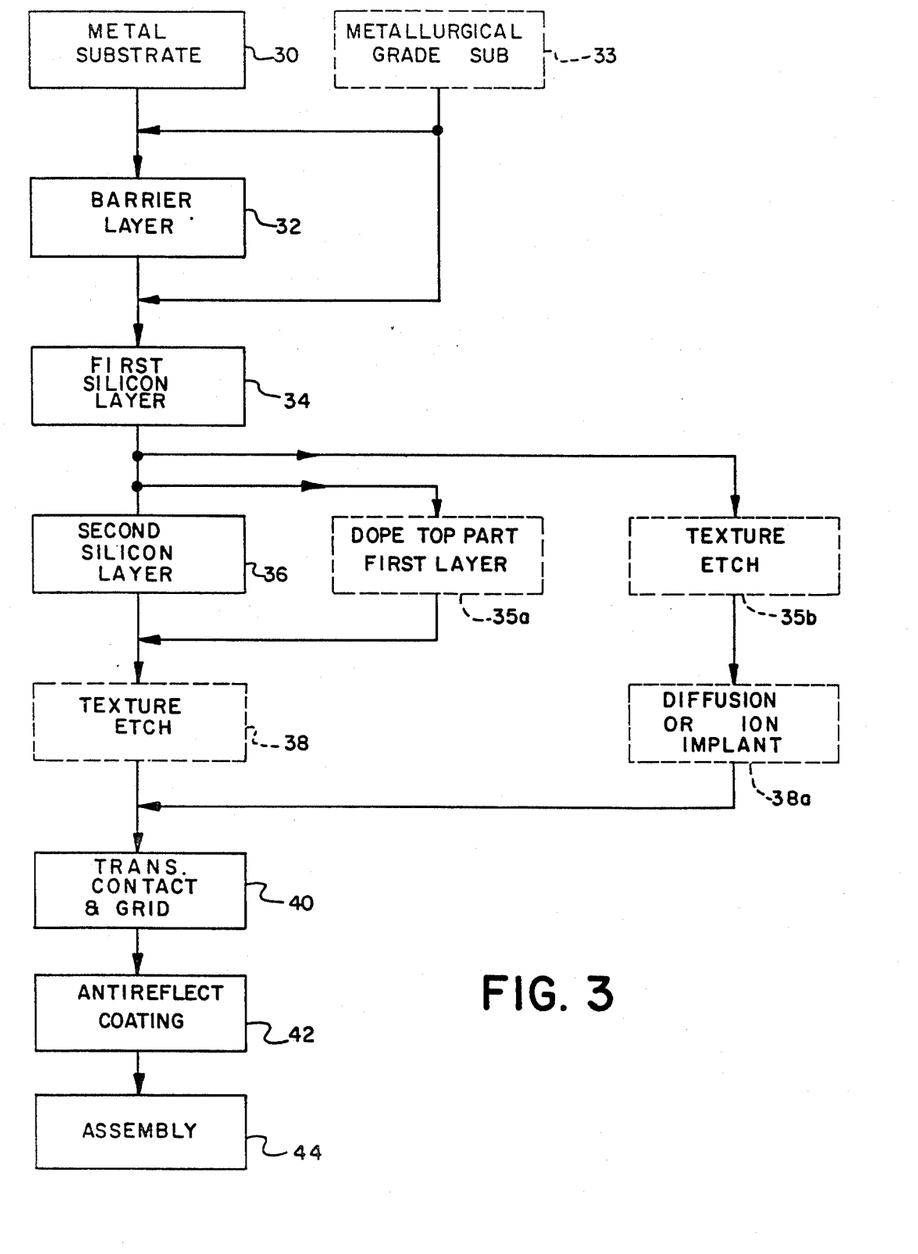
FIG. 3 is a flow diagram of the steps of the method of fabricating the thin film photovoltaic cell as shown in FIG. 3 with additional optional steps provided.

In another embodiment of this invention, as shown in FIG. 3, the fourth step 36, as described above, is replaced by another step 35a involving doping of the first semiconductor layer during growth to form a photovoltaic junction. The doping of the first semiconductor layer can be accomplished by leaving a layer of the tin saturated solution on the grown layer of silicon and then passing the assembly into a doping ambient where a vapor (or example AsH$_3$) dopes the solution to the opposite conductivity type. All of the other steps in the process are the same as described above.

In a still further embodiment of this invention, as illustrated in FIG. 3, the step of texture etching 35b is performed after the first semiconductor layer is grown using the same techniques as described in step five above. The junction, though, is subsequently formed by standard diffusion or ion implantation techniques 38a.

In an additional embodiment which is shown in FIG. 3, metallurgical grade silicon substrates 33 may be substituted for step 30. This embodiment offers the advantage that single crystal or very large grain polycrystalline substrates can be used. The disadvantage is that substitution of metallurgical grade silicon substrates would be more expensive. Furthermore, in this embodiment, the barrier layer can be left out at some cost in solar cell energy conversion efficiency. The surface of the substrate would not have to be textured.

In the process of depositing semiconductor layers, it is preferred to use the sliding boat device similar to that described in the Nelson U.S. Pat. No. 3,565,702 and shown in FIG. 4. It is understood that the deposition of absorber layer 14 and collector layer 16 can all take place within the slider boat device. The slider boat has separate deposition bins arranged serially so that the substrate is moved under one melt bin in order to receive the first epitaxial layer and then under the next melt bin in order to receive the second epitaxial layer. The precipitation of material onto a substrate from a super-saturated solution, known as liquid-phase epitaxy (LPE) for single crystal substrates, is known in the art.

Figure 4:
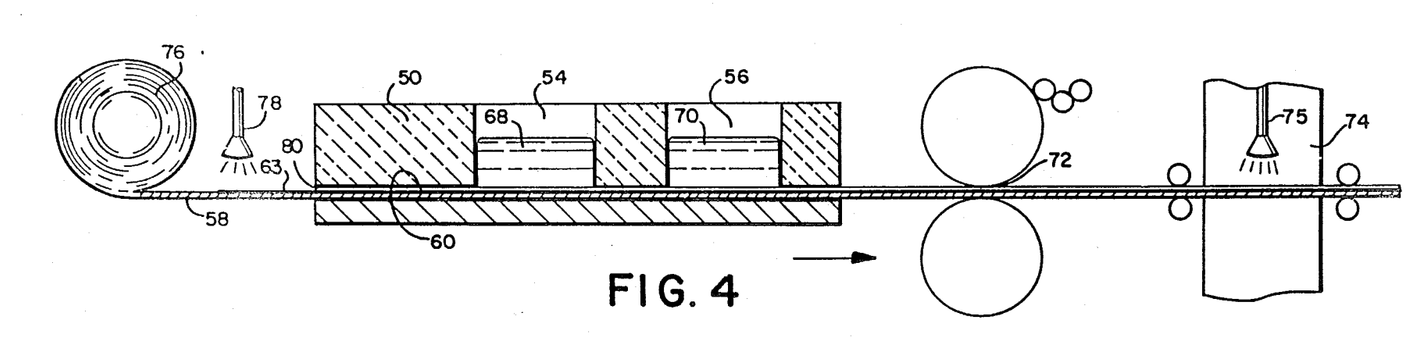
FIG. 4 is a schematic diagram of the apparatus for practicing the method of FIG. 2 using a continuous substrate.
Figure 5:
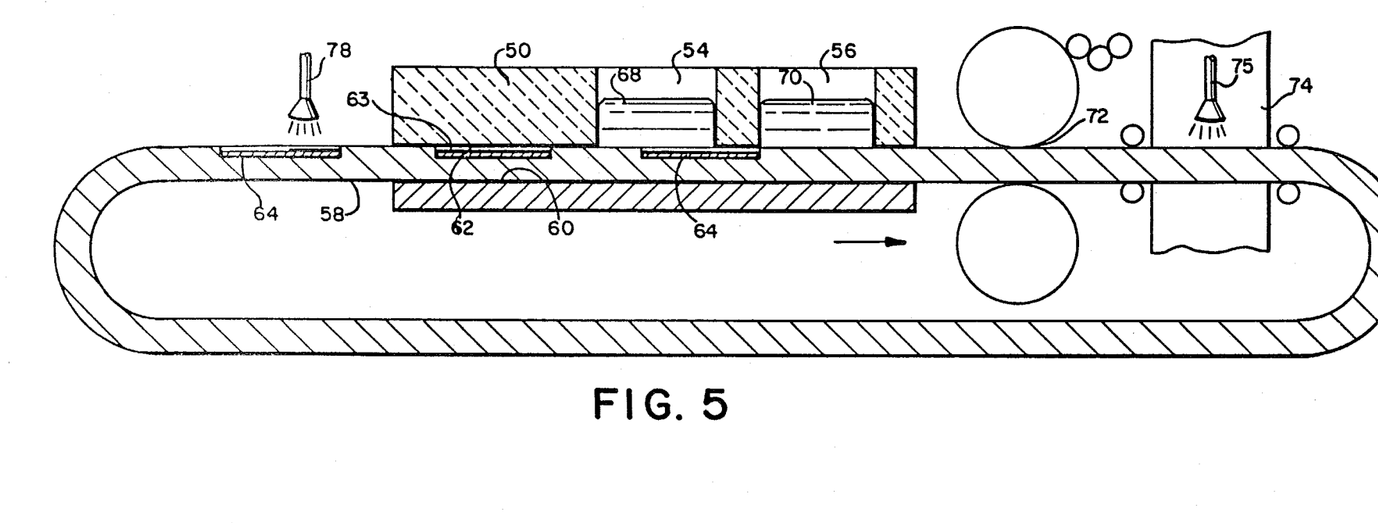
FIG. 5 is a schematic diagram of the apparatus for practicing the method of FIG. 2 using a non-continuous substrate conveyor system.

Referring to FIGS. 4 and 5, the refractory furnace sliding boat 50 typically consists of an inert material such as graphite. The upper surface of the boat 50 is provided with two wells or bins 54 and 56. The boat 50 has a movable slide 58 which may be the substrate as shown in FIG. 4 or made of a refractory material such as graphite as shown in FIG. 5. The slide 58 is disposed in a recess 60 near the bottom of said boat so that the upper surface of said slide is coplanar with the plane or the bottom of each of the wells or bins 54 and 56. In the case of growth on a continuous substrate, as illustrated in FIG. 4, the slide 58 may be substrate 58 which feeds from wheel 76. Alternately, as shown in FIG. 5, the substrate 64 can be attached to slide 58 during the saturated solution growth process. Clearances 80 and 62 between the substrate and the bin openings must accommodate the substrate and the grown layers where appropriate plus a clearance of approximately 50 microns. The substrate is thoroughly cleaned before subsequent semiconductor layers are formed thereon. In any case, the precise size, shape and composition of said sliding boat is not critical.

The barrier layer 63, previously discussed in the second step 32, can be applied in-line by barrier spray 78 as shown in FIGS. 4 and 5 or as a separate step before growth. The substrate may also be textured before the barrier layer is applied.

When the temperature of the furnace boat 50 and its contents has reached 950° C. and the saturated solution is in equilibrium, slide 58 is pulled in the direction shown by the arrow so that the substrate, 58 in FIG. 4 or 64 in FIG. 5, becomes the floor of the first bin 54. Growth is initiated by placing a thermal (or other gradient) across the solution and substrate as discussed in third step 34. The charge 68 in bin 54 preferably consists of a properly doped solution of silicon in a tin solvent so that the epitaxial layer formed directly on top of the barrier layer will become the absorber. Deposition of this first silicon layer was previously discussed in the third step of the process.

The growth of the silicon on the barrier is, at this point, driven by a temperature gradient applied across the solution. The gradient provides for a sufficient amount of silicon to be deposited from the tin melts as was previously described. The slide is moved continuously or semi-continuously in the direction shown by the arrow so that said substrate becomes the floor of bin 56. The charge 70 in bin 56 preferably consists of tin and another silicon melt. This solution could be saturated at a slightly lower temperature than the melt in bin 54. For continuous growth, the charge in bin 56 is also properly doped. This second semiconductor layer which is deposited on top of the first silicon layer becomes the collector. Deposition of the collector was previously discussed in the fourth step 36 of the process. This second layer can also be etched to form an anti-reflection surface.

Variation of the sliding boat growth process such as the aliquot process in which the solution is deposited on the substrate and cooled away from the bin are also acceptable. Doping of the second layer can also be from a vapor as the solution is being cooled. These variations are discussed by R. H. Saul and D. D. Roccasecca, *J. Electrochem. Soc.*, Vol. 120, 1128 (1973) and incorporated herein by reference.

A transparent electrical contact grid is now deposited at 72 on the collector layer according to the technique previously described in the sixth step 40.

Once the preferred metallic or other optically transparent contact grid is applied, an anti-reflection coating is deposited over the electrical contact through spray nozzle 75 in chamber 74. Deposition of the anti-reflection coating was discussed in the seventh step 42. The solar cells can now be assembled into photovoltaic modules or individual solar cells by cutting them from the strip formed after using the sliding boat device.

For the case of crystalline substrates, a plurality of slots 62 are provided in the upper surface of slide 58, as shown in FIG. 5. Each slot 62 is large enough to accommodate the substrate 64 which is initially positioned in the slots. The depth of said slot is designed to accommodate the thickness of said substrate plus the growth layer thickness which is approximately 25 microns. The barrier layer can be omitted during this sequence. This omission will reduce the current generated. This growth sequence is shown in FIG. 5.

In the present invention, as an example, absorber 14 may be made from a solution consisting of tin, silicon, and one of the following dopants: boron, gallium, indium, or aluminum.

In addition, collector 16 may be made from a solution consisting of tin, silicon, and one of the following dopants: phosphorus, arsenic, or antimony.

Collector 16 which is an n-type or p-type semiconductor, is doped in the range of from $10^{18}$ to $10^{19}$ atoms per cubic centimeter in order to increase the open circuit voltage. Absorber 14 which is of opposite conductivity, is doped in the range of from $5 \times 10^{17}$ to $5 \times 10^{18}$ atoms per cubic centimeter to further increase the open circuit voltage. These higher doping concentrations, particularly in the absorber 4, will lead to shorter diffusion lengths than are customarily used for silicon solar cells. These shorter minority carrier diffusion lengths will be acceptable since the silicon absorber is thinner by 80–95%.

The growth of silicon by way of a saturated solution is controlled to provide a thin absorber layer 14 having a thickness between 5 and 50 microns and a thin collector layer 16 having a thickness between 0.1 and 2 microns. Furthermore, this method permits the growth of large silicon grains.

This process of forming thin solar cell quality layers on low cost substrates will work for other crystalline materials, especially gallium arsenide, zinc phosphide, cadmium telluride, and others. In most cases, a different metal for the solution will be selected. Substrates will be chosen to match the thermal coefficient of expansion of the semiconductor layer. Alternatively, a thicker barrier layer may be used to match the thermal coefficient of expansion of the semiconductor layer while absorbing the thermal stress caused by a mis-match between the semiconductor and the substrate. Stresses in the substrate tend to reduce the minority carrier diffusion lengths and accordingly the efficiency.

The method of growth, of the semiconductor absorber and/or collector layers is also applicable for gallium arsenide, indium phosphide, zinc phosphide, cadmium sulfide, zinc-cadmium sulfide, cadmium telluride, and other semiconductors.

The optical geometry, including transparent barrier layer, reflecting thickness of the barrier layer, and substrate texturing will work with absorbers and for collectors made from gallium arsenide, indium phosphide, zinc phosphide, cadmium sulfide, zinc-cadmium sulfide, cadmium telluride, copper sulfide, amorphous semiconductors (including amorphous silicon with substantial amounts of other element chosen from hydrogen, fluorine and other elements), other semiconductors.

What is claimed is:

1. In a method of fabricating a thin film photovoltaic device, which includes as its components a substrate functioning as a support and as an opaque electrical contact, semiconductor layers functioning as an absorber-generator and as a collector-converter, and transparent electrical contact means, said method including depositing at least one semiconductor layer from a liquid saturated solution of a semiconductor material dissolved in a solvent, the improvement being the steps of:
   a. applying over the substrate a metallurgical barrier layer to prevent contamination of the liquid saturated solution and of the semiconductor layers by the substrate;
   b. continuously depositing over the metallurgical barrier layer a first semiconductor layer of a first selected conductivity type by moving the substrate through a liquid saturated solution of a first semiconductor material dissolved in a solvent and applying a gradient across the saturated solution to drive the growth of the first semiconductor layer.

2. In the method of claim 1 including maintaining the substrate as the cooler end of a temperature gradient.

3. In the method of claim 2 wherein the substrate is cooled by a heat sink.

4. In the method of claim 2 wherein the substrate is cooled by a flowing cool gas and the gradient is maintained by controlling the flow of gas.

5. In the method of claim 2 wherein the step of applying a gradient includes applying heat to the saturated solution distal to the cooler end of the temperature gradient.

6. In the method of claim 1 wherein the step of applying a gradient includes applying an electric field between the saturated solution and the substrate.

7. In the method of claim I wherein the temperature of the saturated solution is essentially constant in time.

8. In the method of claim 1 wherein solid semiconductor material is floated on top of the saturated solution.

9. In the method of claim 8 wherein the solid semiconductor material is replenished over time.

10. In the method of claim 1 wherein the substrate is placed beneath the saturated solution.

11. In the method of claim 1 wherein the semiconductor layer is deposited continuously over a continuous substrate by continuous movement of the substrate.

12. In the method of claim 1 wherein a non-continuous substrate is placed in a moveable slide and the semiconductor layer is deposited semi-continuously by movement of the slide.

13. In the method of claim 1 wherein the semiconductor material is selected from silicon, gallium arsenide, cadmium telluride, indium phosphide, zinc phosphide, cadmium sulfide, and zinc-cadmium sulfide.

14. In the method of claim 1 wherein the solvent is a molten metal.

15. In the method of claim 1 wherein the solvent is a molten compound.

16. In the method of claim 1 wherein the saturated solution includes dopant material selected to provide the semiconductor layer with conductivity of a selected type.

17. In the method of claim 1 wherein the saturated solution is a saturated solution of silicon in molten tin.

18. In the method of claim 17 wherein the saturated solution comprises six atomic percent silicon and the solution is maintained at a temperature of 950 degrees centigrade.

19. In the method of claim 17 wherein the semiconductor layer is silicon having p-type conductivity and the dopant material is selected from boron, aluminum, and gallium.

20. In the method of claim 1 including the further step of depositing a second semiconductor layer of an opposite conductivity type over the first semiconductor layer.

21. In the method of claim 20 wherein the first and second semiconductor layers are of the same semiconductor material in a homojunction photovoltaic device.

22. In the method of claim 20 wherein the second semiconductor layer is of a different semiconductor material in a heterojunction photovoltaic device.

23. In the method of claim 20 wherein the step of depositing the second semiconductor layer is depositing from a second liquid saturated solution of a second semiconductor material dissolved in a solvent by applying a gradient across the second saturated solution to drive the growth of the second semiconductor layer over the first semiconductor layer.

24. In the method of claim 23 wherein the second saturated solution includes dopant material selected to provide the second semiconductor layer with the selected conductivity type.

25. In the method of claim 23 wherein the second saturated solution is a saturated solution of silicon in molten tin and the dopant is phosphorus, arsenic, or antimony.

26. In the method of claim 1 including the step of texturing the surface of the substrate upon which the metallurgical barrier layer is to be applied to a predetermined geometrical shape to provide for optical confinement.

27. In the method of claim 26 wherein the substrate is a metal and the texturing step is impressing a roller having a surface with a selected reflector geometry against the substrate surface upon which the metallurgical barrier layer is to be applied.

28. In the method of claim 26 wherein the metallurgical barrier layer is an optically transparent metallurgical barrier layer.

29. In the method of claim 26 wherein the metallurgical barrier layer is an optical reflection metallurgical barrier layer to provide for enhanced reflection of light.

30. In the method of claim 1 wherein the metallurgical barrier layer is an optically transparent metallurgical barrier layer.

31. In the method of claim 1 wherein the metallurgical barrier layer is an optical reflection metallurgical barrier layer to provide for enhanced reflection of light.

32. In the method of claim 1 wherein the liquid saturated solution is cooled sufficiently to deposit the semiconductor layer over the substrate and including the steps of removing the substrate from the growth solutions, reheating the solution, replenishing the semiconductor material and repeating the sequence.

33. A method of fabricating a thin film photovoltaic device on a substrate selected from a group consisting of metals, metal alloys, and metallurgical grade semiconductors, comprising the steps of:
  (a) texturing the substrate;
  (b) applying over the textured substrate an optically transparent, conducting metallurgical barrier layer;
  (c) continuously depositing over the barrier layer a first semiconductor layer of a first selected conductivity type by moving the substrate through a liquid saturated solution of a first semiconductor material dissolved in a solvent and applying a temperature gradient across the saturated solution to drive the growth of the first semiconductor layer;
  (d) continuously depositing a second semiconductor layer having a conductivity type opposite the first selected conductivity type by moving the substrate through an additional liquid saturated solution of a second semiconductor material dissolved in a solvent and applying a temperature gradient across the second saturated solution to drive the growth of the second semiconductor layer.

34. A method of fabricating a thin film photovoltaic device on a substrate selected from a group consisting of metals, metal alloys, and metallurgical grade semiconductors, comprising the steps of:
  (a) texturing the substrate;
  (b) applying over the textured substrate an optical reflection metallurgical barrier layer having a predetermined depth to provide for enhanced reflection of light;
  (c) continuously depositing over the optical reflection barrier layer a first semiconductor layer of a first selected conductivity type by moving the substrate through a liquid saturated solution of a first semiconductor material dissolved in a solvent and applying a temperature gradient across the saturated solution to drive the growth of the first semiconductor layer;
  (d) continuously depositing a second semiconductor layer having a conductivity type opposite the first selected conductivity type by moving the substrate through an additional liquid saturated solution of a second semiconductor material dissolved in a solvent and applying a temperature gradient across the second saturated solution to drive the growth of the second semiconductor layer.

35. A method of fabricating a thin film photovoltaic device on a substrate selected from a group consisting of metals, metal alloys, and metallurgical grade semiconductors, comprising the steps of:
  (a) texturing the substrate;
  (b) applying over the textured substrate an optically transparent, conducting metallurgical barrier layer;
  (c) continuously depositing over the optically transparent barrier layer a first semiconductor layer of a first selected conductivity type by moving the substrate through a liquid saturated solution of a first semiconductor material dissolved in a solvent and applying a temperature gradient across the saturated solution to drive the growth of the first semiconductor layer;
  (d) doping a layer of liquid saturated solution that remains on the deposited first semiconductor layer to provide a second semiconductor layer having conductivity type opposite to said first semiconductor layer.

36. In the method of claims 33, 34, 35 or 32 wherein there is provided the further step of texture etching the surface of the second semiconductor layer to provide for light trapping of photons entering the device.

37. In the method of claims 33, 34, 35 or 32 wherein the first and second semiconductor layers are selected from the group consisting of silicon, copper sulfide, gallium arsenide, indium phosphide, zinc phosphide, cadmium telluride, zinc cadmium sulfide, and cadmium telluride.

* * * * *